(12) United States Patent
Hu et al.

(10) Patent No.: US 11,369,929 B2
(45) Date of Patent: Jun. 28, 2022

(54) NANOPARTICLES AND SYSTEMS AND METHODS FOR SYNTHESIZING NANOPARTICLES THROUGH THERMAL SHOCK

(71) Applicant: University of Maryland, College Park, College Park, MD (US)

(72) Inventors: Liangbing Hu, Potomac, MD (US); Yanan Chen, Hyattsville, MD (US); Yonggang Yao, College Park, MD (US)

(73) Assignee: UNIVERSITY OF MARYLAND, COLLEGE PARK, College Park, MD (US)

(*) Notice: Subject to any disclaimer, the term of this patent is extended or adjusted under 35 U.S.C. 154(b) by 691 days.

(21) Appl. No.: 16/016,395

(22) Filed: Jun. 22, 2018

(65) Prior Publication Data

US 2018/0369771 A1 Dec. 27, 2018

Related U.S. Application Data

(60) Provisional application No. 62/523,646, filed on Jun. 22, 2017.

(51) Int. Cl.
*B01J 3/08* (2006.01)
*C01B 32/198* (2017.01)
(Continued)

(52) U.S. Cl.
CPC . *B01J 3/08* (2013.01); *B01J 6/00* (2013.01); *B01J 19/121* (2013.01); *B22F 1/054* (2022.01);
(Continued)

(58) Field of Classification Search
CPC . B01J 3/08; C23C 16/06; C23C 16/56; C23C 16/45555; B22F 1/0096; B22F 3/087; B22F 5/006; B82Y 30/00
(Continued)

(56) References Cited

U.S. PATENT DOCUMENTS

| 7,214,361 | B2* | 5/2007 | Harutyunyan | ......... B82Y 30/00 423/447.3 |
| 7,252,749 | B2* | 8/2007 | Zhou | ..................... B82Y 30/00 204/484 |

(Continued)

OTHER PUBLICATIONS

"In Situ High Temperature Synthesis of Single-Component Metallic Nanoparticles" Yonggang Yao et al. ACS Cent. Sci, 3, 294-301. (2017) (Year: 2017).*

(Continued)

*Primary Examiner* — Alexandra M Moore
(74) *Attorney, Agent, or Firm* — RowanTree Law Group, PLLC; Frederick F. Rosenberger

(57) ABSTRACT

Systems and methods of synthesizing nanoparticles on substrates using rapid, high temperature thermal shock. A method involves depositing micro-sized particles or salt precursors on a substrate, and applying a rapid, high temperature thermal shock to the micro-sized particles or the salt precursors to become nanoparticles on the substrate. A system may include a rotatable member that receives a roll of a substrate sheet having micro-sized particles or salt precursors; a motor that rotates the rotatable member so as to unroll the substrate; and a thermal energy source that applies a short, high temperature thermal shock to the substrate. The nanoparticles may be metallic, ceramic, inorganic, semiconductor, or compound nanoparticles. The substrate may be a carbon-based substrate, a conducting substrate, or a non-conducting substrate. The high temperature thermal shock process may be enabled by electrical Joule heating, microwave heating, thermal radiative heating, plasma heating, or laser heating.

16 Claims, 16 Drawing Sheets

(51) Int. Cl.
| | |
|---|---|
| C23C 16/06 | (2006.01) |
| C23C 16/56 | (2006.01) |
| B22F 3/087 | (2006.01) |
| B22F 5/00 | (2006.01) |
| C01G 51/00 | (2006.01) |
| C23C 16/455 | (2006.01) |
| C01G 49/12 | (2006.01) |
| B01J 6/00 | (2006.01) |
| C01B 32/184 | (2017.01) |
| B01J 19/12 | (2006.01) |
| B22F 9/14 | (2006.01) |
| B22F 1/054 | (2022.01) |
| B22F 1/148 | (2022.01) |
| B82Y 30/00 | (2011.01) |
| B82Y 40/00 | (2011.01) |
| B22F 7/04 | (2006.01) |

(52) U.S. Cl.
CPC .............. $B22F\ 1/148$ (2022.01); $B22F\ 3/087$ (2013.01); $B22F\ 5/006$ (2013.01); $B22F\ 9/14$ (2013.01); $C01B\ 32/184$ (2017.08); $C01B\ 32/198$ (2017.08); $C01G\ 49/12$ (2013.01); $C01G\ 51/30$ (2013.01); $C23C\ 16/06$ (2013.01); $C23C\ 16/45555$ (2013.01); $C23C\ 16/56$ (2013.01); $B01J\ 2219/00051$ (2013.01); $B01J\ 2219/00141$ (2013.01); $B01J\ 2219/0894$ (2013.01); $B22F\ 7/04$ (2013.01); $B22F\ 2998/10$ (2013.01); $B82Y\ 30/00$ (2013.01); $B82Y\ 40/00$ (2013.01); $C01P\ 2002/01$ (2013.01); $C01P\ 2002/85$ (2013.01); $C01P\ 2004/32$ (2013.01); $C01P\ 2004/64$ (2013.01); $C01P\ 2004/80$ (2013.01)

(58) Field of Classification Search
USPC ........................................................ 427/180
See application file for complete search history.

(56) References Cited

U.S. PATENT DOCUMENTS

| | | | | |
|---|---|---|---|---|
| 8,052,951 | B2* | 11/2011 | Menchhofer | B82Y 40/00 423/447.2 |
| 2013/0130383 | A1* | 5/2013 | Mukhopadhyay | C09D 5/14 435/395 |

OTHER PUBLICATIONS

"Surface Modification of Detonation Nanodiamonds with Platinum and Palladium Nanoparticles" Isakova et al. International Journal of Chemistry; vol. 7, No. 1. Dec. 19, 2014. doi:10.5539/ijc.v7n1p1. (Year: 2014).*
"PdxCoy Nanoparticle/Carbon Nanofiber Composites with Enhanced Electrocatalytic Properties" Dong Liu, Qiaohui Guo, Haoqing Hou, Osamu Niwa, Tianyan You. ACS Catalysis. 2014, 4, 1825-1829. dx.doi.org/10.1021/cs5000153 (Year: 2014).*
Zhou et al., Tuning the High-Temperature Wetting Behavior of Metals toward Ultrafine Nanoparticles, Angew. Chemie Int. Ed, 57, 2625-2629 (2018).
Li et al., In Situ "Chainmail Catalyst" Assembly in Low-Tortuosity, Hierarchical Carbon Frameworks for Efficient and Stable Hydrogen Generation, Adv. Energy Mater., 1801289 (2018).
Yao et al., In Situ High Temperature Sythesis of Single-Component Metallic Nanoparticles, ACS Cent. Sci, 3 ,294-301 (2017).
Yang et al., Ultrafine Silver Nanoparticles for Seeded Lithium Desposition toward Stable Lithium Metal Anode, Adv. Mater., 29, 1702714 (2017).
Chen et al., FeS2 Nanoparticles Embedded in Reduced Graphene Oxide toward Robust, High-Performance Electrocatalysts, Adv. Energy Mater., 7, 1700482 (2017).
Li et al., In Situ, Fast, High-Temperature Synthesis of Nickel Nanoparticles in Reduced Graphene Oxide Matrix, Adv. Energy Mater., 7, 1601783 (2017).
Xu et al., Universal, in Situ Transformation of Bulky Compounds into Nanoscale Catalysts by High-Temperature Pulse, Nano Lett., 17, 5817-5822 (2017).
Chen et al., Rapid, in Situ Synthesis of High Capacity Battery Anodes through High Temperature Radiation-Based Thermal Shock, Nano Lett, 16, 5553-5558 (2016).
Chen et al., Ultra-fast self-assembly and stabilization of reactive nanoparticles in reduced graphene oxide films, Nat. Commun., 7, 12332 (2016).
Chen et al., Synthesis of 'clean' and well-dispersive Pd nanoparticles with excellent electrocatalytic property on graphene oxide, J. Am. Chem. Soc., 133, 3693-3695 (2011).
Ghorbani, A review of methods for synthesis of Al nanoparticles, Orient. J. Chem., 30, 1941-1949 (2014).
Tsuzuki, Commercial scale production of inorganic nanoparticles, Int. J. Nanotechnol., 6, 567 (2009).
Gauthier et al., A low-cost and high performance ball-milled Si-based negative electrode for high-energy Li-ion batteries, Energy Environ. Sci., 6, 2145-2155 (2013).
Eliezer et al., Synthesis of nanoparticles with femtosecond laser pulses, Phys. Rev. B 69, 144119 (2004).
Amoruso et al., Femtosecond laser pulse irradiation of solid targets as a general route to nanoparticle formation in a vacuum, Phys. Rev. B 71, 033406 (2005).
Sindhu et al., Generation and characterization of nano aluminium powder obtained through wire explosion process, Bull, Mater. Sci., 30 187-195 (2007).
Swihart, Vapor-phase synthesis of nanoparticles, Curr. Opin. Colloid Interface Sci., 8, 127-133 (2003).
Chung et al., Top-Down meets bottom-up: dip-pen nanolithography and DNA-directed assembly of nanoscale electrical circuits. Small, vol. 1, Issue 1, 64 69, Wiley Online Library (2004).
Wang et al., Bottom-up and top-down approaches to the synthesis of monodispersed spherical colloids of low melting-point metals, Nano Lett, 4, 2047-2050 (2004).
Sun et al., Shape-controlled synthesis of gold and silver nanoparticles, Science, 298, 2176-2179 (2002).
Sau et al., Room temperature, high-yield synthesis of multiple shapes of gold nanoparticles in aqueous solution, J. Am. Chem. Soc, 126, 8648-8649 (2004).
Gromov et al., Metal Nanopowders: Production, Characterizatioin, and Energetic Applications (John Wiley & Sons, 2014), Chapter 4.
Murray, Aluminbum production using high-temperature solar process heat, Sol Energy, 66, 133-142 (1999).
Wong et al., Synthesis of Ultrasmall, Homogeneously Alloyed, Bimetallic Nanoparticles on Silica Supports, Science, 358, Issue 6369, 1427-1430 (2017).
Wilcoxon et al., Synthesis, Structure and Properies of Metal Nannoclusters, Chem. Soc. Rev., 35, 1162-1194 (2006).
Prieto et al., Towards Stable Catalysts by Controlling Collective Properties of Supported Metal Nanoparticles, Nat. Mater. 12, 34-39 (2013).
Liu et al., Delineating the Pathways for the Site-Directed Synthesis of Individual Nanoparticles on Surfaces, Proc. Natl. Acad. Sci., 110, 887-891 (2013).
Alvarado et al., Photochemical versus Thermal Synthesis of Cobalt Oxyhydroxide Nanocrystals, J. Phys. Chem., 116, 10382-10389 (2012).
Pang et al., 1D Nanocrystals with Precisely Controlled Dimensions, Compositions, and Architectures, Science, 353, 1268-1272 (2016).
Gilroy et al., Bimetallic Nanocrystals: Syntheses, Properties, and Applicatioins, Chem. Rev., 116, 10414-10472 (2016).
Fan et al., Crystal Phase-Controlled Synthesis, Properties and Applications of Noble Metal Nanomaterials, Chem. Soc. Rev., 45, 63-82 (2016).

(56) References Cited

OTHER PUBLICATIONS

Chen et al., Palladium-Based Nanomaterials: Synthesis and Electrochemical Applications of Noble Metal Nanomaterials, Chem Rev., 115, 11999-12044 (2015).
Ganguli et al., Microemulsion-Based Synthesis of Nanocrystalline Materials, Chem. Soc. Rev., 39, 474-485 (2010).
Amendola et al., Laser Ablation Synthesis in Solution and Size Manipulation of Nobel Metal Nanoparticles, Phys. Chem Chem. Phys., 11, 3805-3821 (2009).
Jin et al., Decoration, Migration, and Aggregation of Palladium Nanoparticles on Graphene Sheets, Chem. Mater., 22, 5695-5699 (2010).
Wang et al., Synthesis and Microwave Absorption Properties of Fe—C Nanofibers by Electrospinning with Disperse Fe Nanoparticles Parceled by Carbon, 74, 312-318 (2014).
Manikandan et al., Structural, Optical and Magnetic Properties of Fe304 Nanoparticles Prepared by a Facile Microwave Combustion Method, J. Ind Eng. Chem. 20, 2077-2085 (2014).
Bao et al., Flexible, High Temperature, Planar Lighting with Large Scale Printable Nanocarbon Paper, Adv. Mater., 28, 4684-4691 (2016).
Kim et al., Bright Visible Light Emission from Graphene, Nat. Nanotechnol. 10, 1-7 (2015).
Mann et al., Electrically Driven Thermal Light Emission from Individual Single-Walled Carbon Nanotubes, Nat. Nanotechnol., 2, 33-38 (2007).
Yao et al., Three-Dimensional Printable High-Temperature and High-Rate Heaters, ACS Nano, 10, 5272-5279 (2016).
Yao et al., Carbon Welding by Ultrafast Joule Heating, Nano Lett, 16, 7282-7289 (2016).

\* cited by examiner

US 11,369,929 B2

NANOPARTICLES AND SYSTEMS AND METHODS FOR SYNTHESIZING NANOPARTICLES THROUGH THERMAL SHOCK

CROSS-REFERENCE TO RELATED APPLICATIONS

This application claims the benefit of and priority to U.S. Provisional Application No. 62/523,646, filed on Jun. 22, 2017, the entire contents of which are incorporated herein by reference.

BACKGROUND

Technical Field

This disclosure relates to nanoparticles synthesized or constructed on a substrate of interest through thermal shock, their methods of construction, and corresponding systems.

Related Art

The synthesis of nanoparticles of metal and metal compounds has attracted a massive amount of attention because of their good catalytic activity. The conventional synthesis method—wet chemistry—involves complex chemical reactions where precise control of reaction conditions is required. This makes it challenging to synthesize uniform small-size nanoparticles. Moreover, uniformly dispersing nanoparticles on a substrate is even more challenging. Slight differences in reaction conditions can drastically change the morphology of the end product, which may be detrimental to the performance of the catalyst. This problem may become more severe and relevant when the catalyst has dimensions on the nanoscale level.

SUMMARY

Existing challenges associated with the foregoing, as well as other challenges, are overcome by methods for synthesizing nanoparticles on a substrate, and also by systems and apparatuses that operate in accordance with these methods.

In aspects, this disclosure features a method of forming nanoparticles on a substrate. The method includes depositing micro-sized particles or salt precursors on a substrate, and applying a rapid, high temperature thermal shock to the substrate and the micro-sized particles or the salt precursors to cause the micro-sized particles or the salt precursors to self-assemble into nanoparticles on the substrate.

In another aspect, this disclosure features a system for synthesizing nanoparticles on a substrate. The system includes a rotatable member that receives a roll of a substrate sheet on which is deposited micro-sized particles or salt precursors, and a motor that rotates the rotatable member so as to unroll consecutive portions of the substrate sheet from the roll. The system also includes a thermal energy source, such as a thermal radiation source or a direct Joule heating source, that repeatedly applies a short, high temperature radiation pulse to consecutive portions of the substrate sheet that are unrolled from the roll by causing the motor to rotate the first rotatable member to cause the micro-sized particles or the salt precursors to self-assemble into nanoparticles on consecutive portions of the substrate sheet.

In yet another aspect, this disclosure features a composite, such as a film. The composite includes a substrate and a plurality of nanoparticles formed on the substrate from a micro-sized particle or salt precursors exposed to a rapid, high temperature thermal shock.

BRIEF DESCRIPTION OF THE DRAWINGS

The accompanying drawings, which are incorporated in and constitute a part of the specification, illustrate embodiments of the disclosure and together with a general description of the disclosure given above, and the detailed description of the embodiment(s) given below, serve to explain the principles of the present disclosure.

DETAILED DESCRIPTION

Figure 1A:
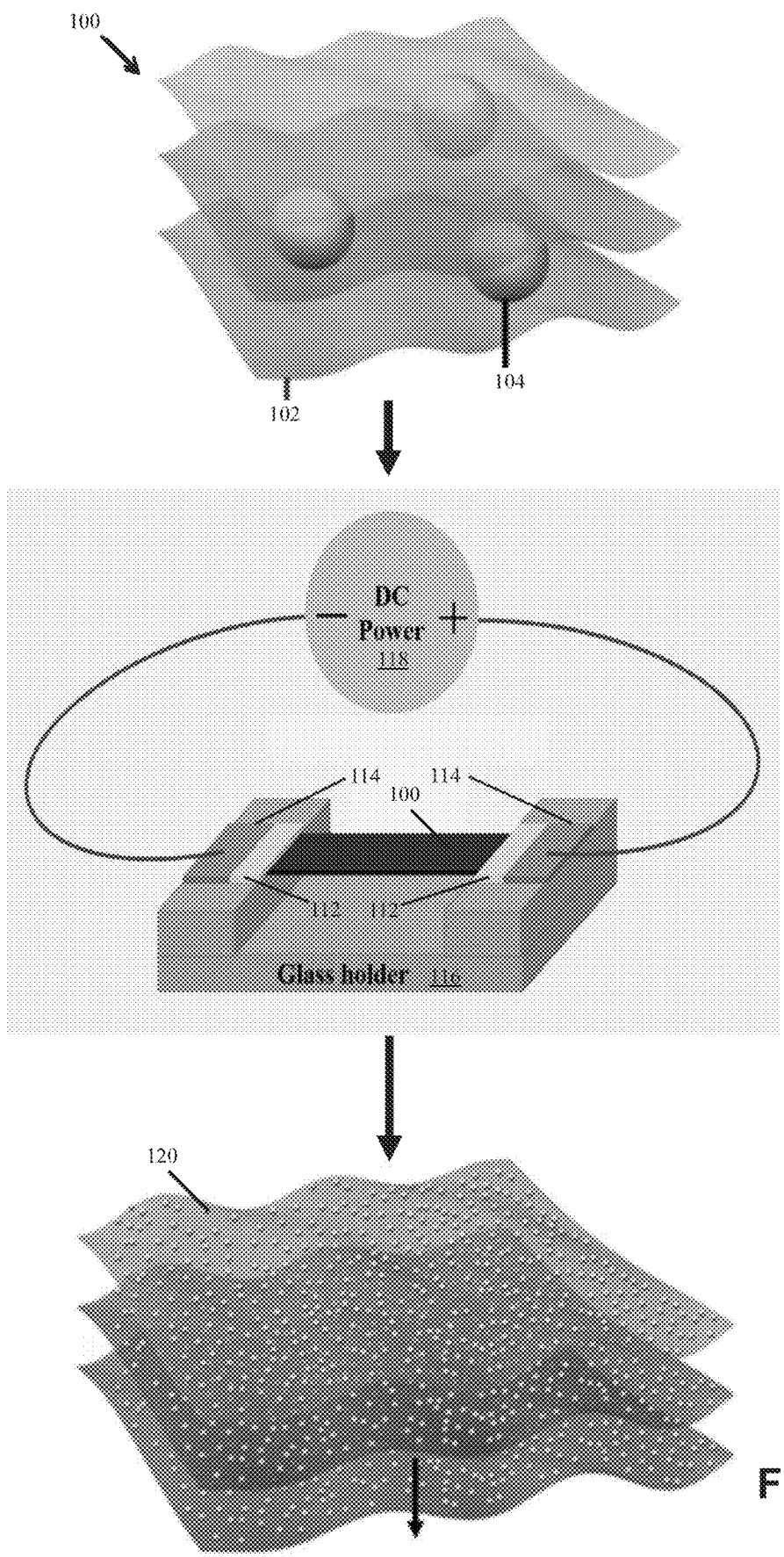
FIG. 1A is a schematic diagram illustrating an example method for constructing nanoparticles on a substrate in accordance with this disclosure.

Embodiments of the systems and methods of synthesizing nanoparticles on substrates are described in detail with reference to the drawings, in which like or corresponding reference numerals designate identical or corresponding elements in each of the several views.

This disclosure relates to low cost, simple, ultra-fast synthesis of nanoparticles for nanocatalysis, which is beneficial for the development of high performance nanocatalysts used for energy conversion and electrochemical processes, such as water splitting, fuel cells, metal air batteries, and other catalytic reactions, such as biomass conversion, ammonia oxidation, and so on.

FIG. 1A illustrates an example method for constructing nanoparticles (e.g., metallic or semiconductor nanoparticles) on a substrate (e.g., reduced graphene oxide (RGO)) from micro-sized particles. The micro-sized particles in the substrate are self-assembled into nanoparticles when heated by direct Joule heating. The micro-sized particles may include or may be made of bulk materials that are large aggregates or raw minerals. The micro-sized particles may include or may be made of various elements, including, for example, aluminum, tin, gold, palladium, iron, nickel, silicon, or any combination of these micro-sized particles. The nanoparticles may include or may be metallic, ceramic, inorganic, semiconductor, compound nanoparticles, or any combination of these nanoparticles. In some embodiments, the synthesized nanoparticles may have an average diameter of between about 1.0 nm and about 30 nm. In other embodiments, the synthesized nanoparticles may have an average diameter outside this range, e.g., between about 30 nm and about 100 nm.

The substrate may be a carbon-based substrate, a conducting substrate, or a non-conducting substrate. The carbon-based substrate may be a reduced graphene oxide substrate or a carbon nanofiber substrate. In some embodiments, the surface of the substrate may be treated to modify the wetting behavior and thereby change the nanoparticle size. For example, the surface of the substrate may be coated with an oxide coating by an atomic layer deposition (ALD) process or a solution process.

Figure 1B:
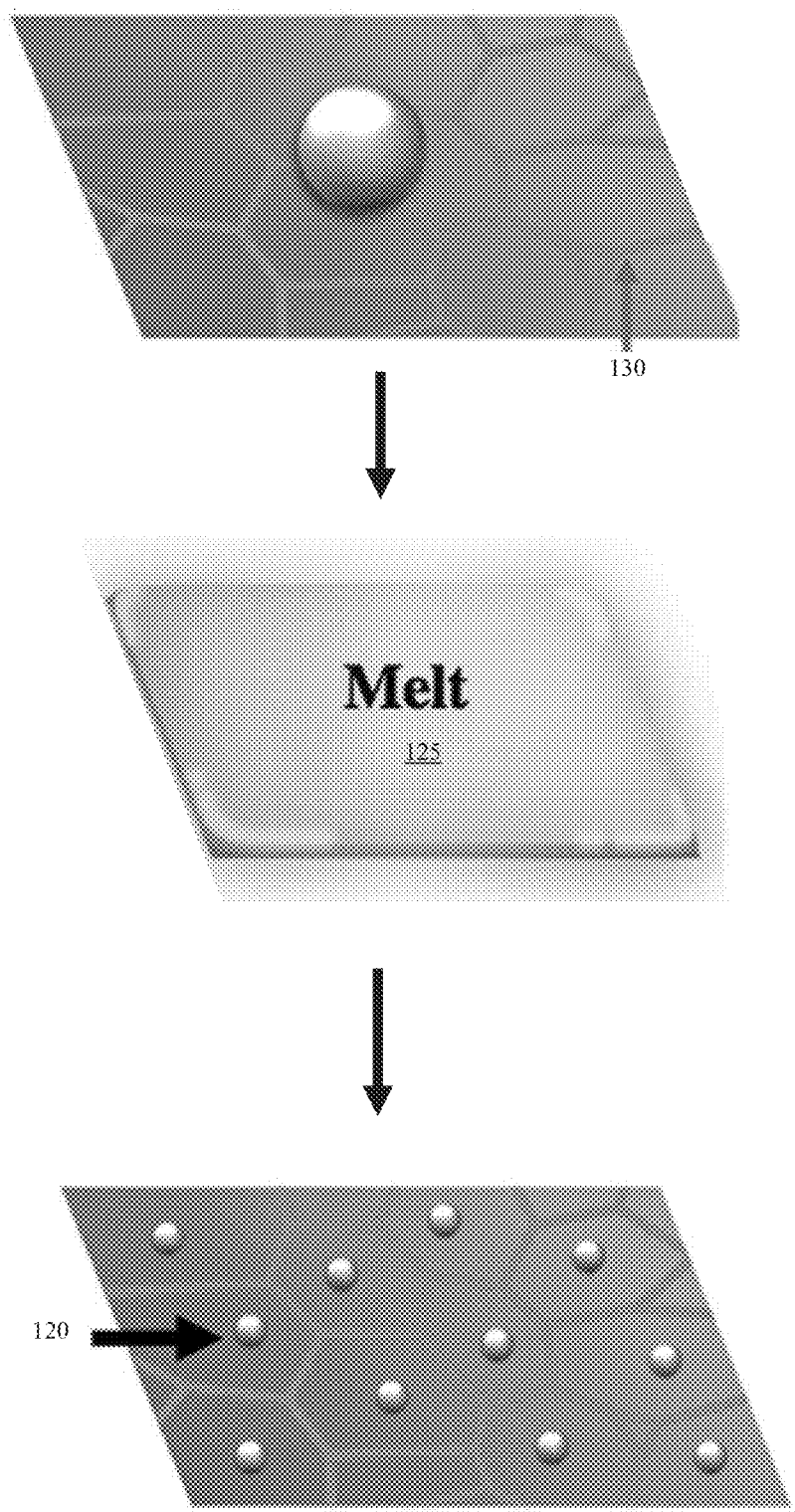
FIG. 1B is a schematic diagram illustrating an example mechanism for nanoparticle formation in accordance with this disclosure.
Figure 1C:
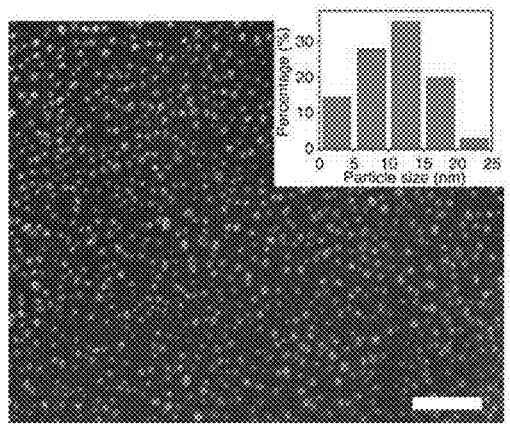
FIGS. 1C-1H are example scanning electron microscope (SEM) images illustrating nanoparticles of different materials formed in RGO networks in accordance with this disclosure.
Figure 1D:
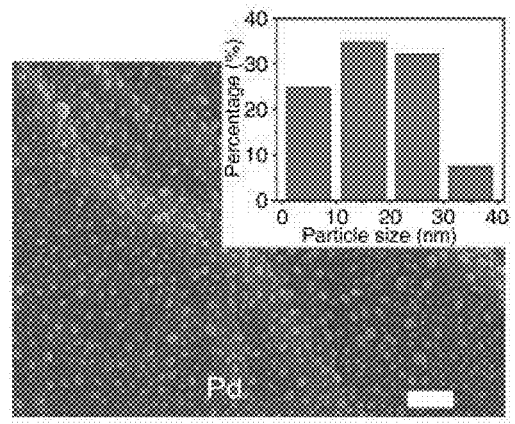
Figure 1E:
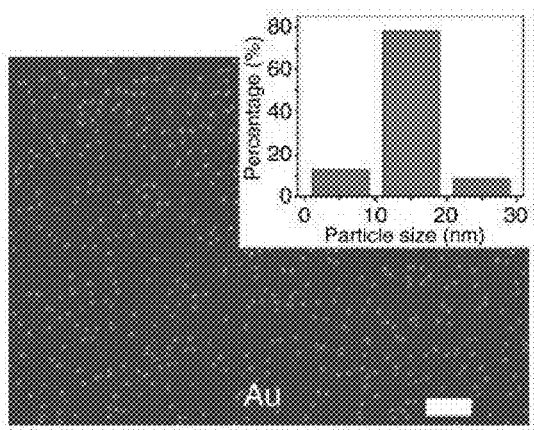
Figure 1F:
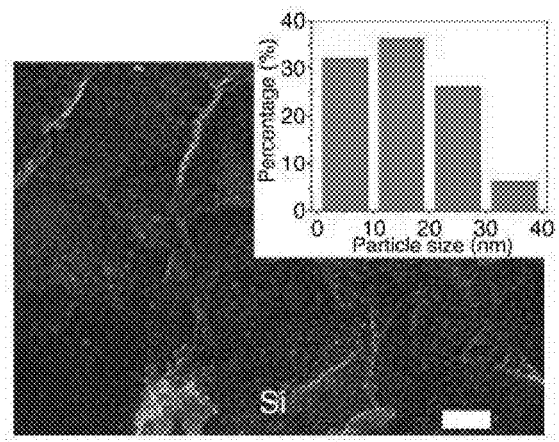
Figure 1G:
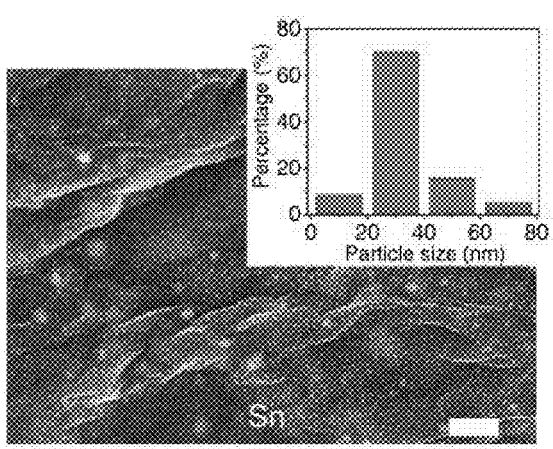
Figure 1H:
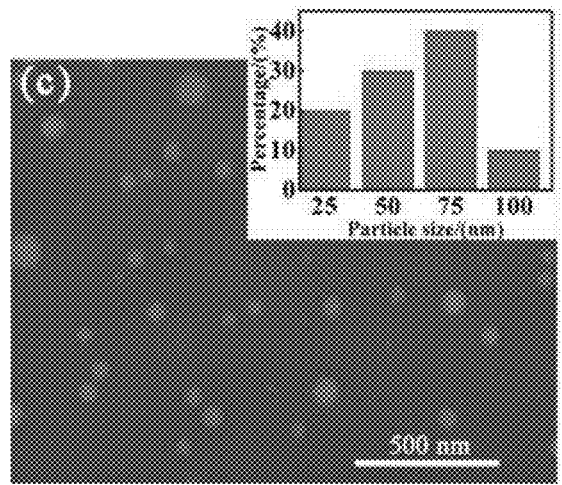

FIG. 1B illustrates an example mechanism for nanoparticle formation in accordance with embodiments. Agglomeration and coalescence of the nanoparticles, which is driven by surface energy minimization, is suppressed by the defects 130 of RGO in-plane and RGO layers out-of-plane. The defects 130 serve as barriers for atom migration to keep the uniformly distributed nanoparticles 120 separated. During heating or melting 125, the particles within the matrix are protected from oxidation by the RGO sheets, due to the impermeability of RGO to $O_2$ and $H_2O$.

The RGO sheets work well as a host material because of their defect sites and high melting temperature. For example, the RGO sheets may be stable up to 3300 K. Thus, the micro-sized particles melt 125 upon heating and self-assemble into nanoparticles 120 due to the confinement by the defects 130 of the RGO sheet. FIGS. 1C-1H show images of example metallic nanoparticles distributed on RGO substrates. In embodiments, the thermal shock may be provided by other suitable heating methods including (a) radiation heating, (b) microwave heating, (c) plasma heating, and (d) laser heating. In embodiments the temperature of the thermal shock may range between 500K and 3000K. In other embodiments, the temperature of the thermal shock may be outside that range.

Figure 9:
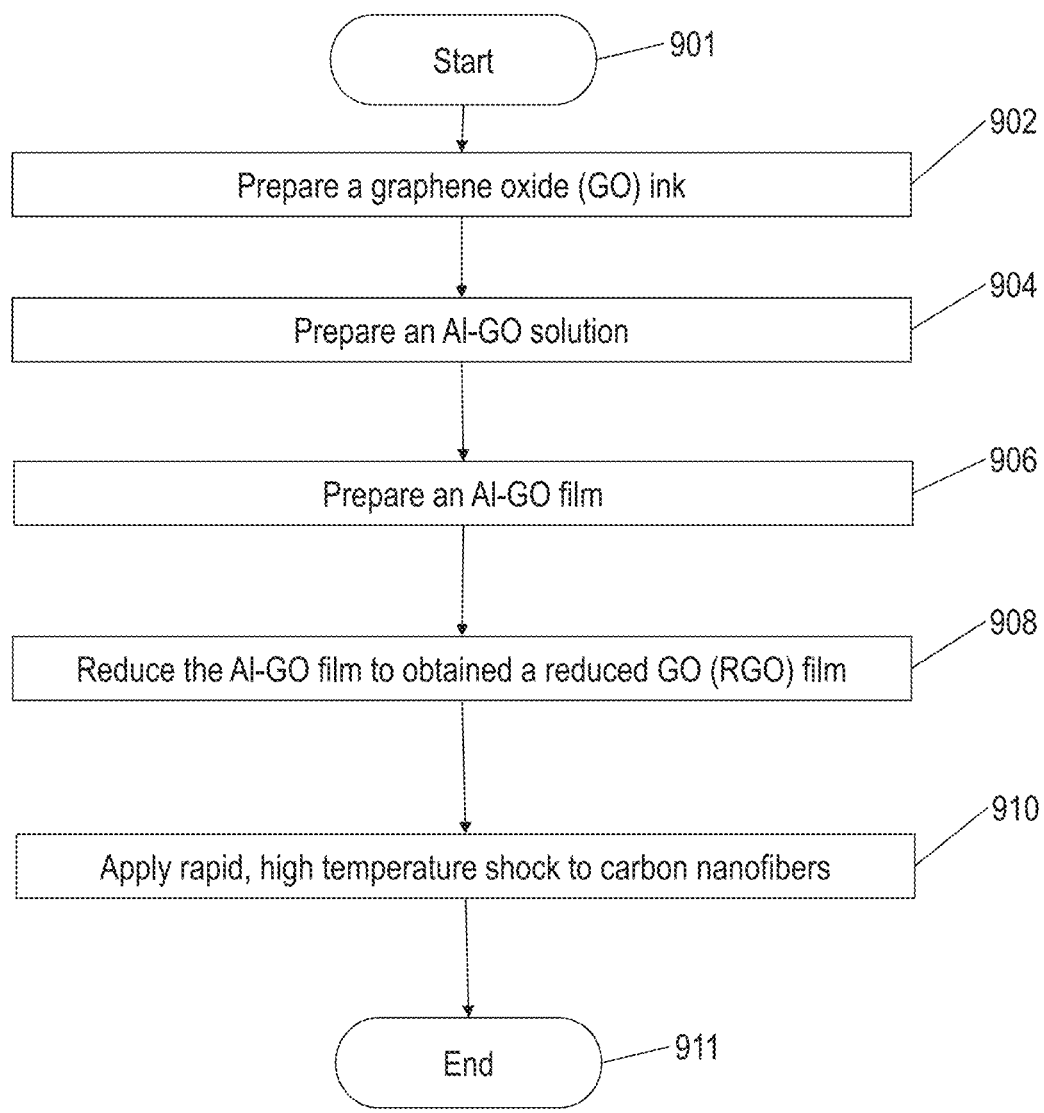
FIG. 9 is a flow diagram illustrating a method of synthesizing a metallic nanoparticle on a substrate from a micro-sized metallic particle in according with this disclosure.

In embodiments, the substrate may be formed and the micro-sized particles may be deposited on or applied to the substrate to form a film according to any suitable procedures. For example, as illustrated by the method of FIG. 9, an Al-GO film may be formed by preparing a GO ink (block 902), preparing an Al-GO solution (block 904), preparing an Al-GO film (block 906), and reducing the Al-GO film (block 908).

In some embodiments, the Hummer's method may be employed for the preparation of GO ink (block 902). First, a suspended solution of a mixture of natural graphite flakes (e.g., 1.5 g) and $KMnO_4$ (e.g., 9 g) in acid of $H_2SO_4/H_3PO_4$ (e.g., 200 mL with a volume ratio 9:1) is prepared. For better dispersion, the solution may be heated (e.g., heated to 50° C.) while stirred continuously for an appropriate period (e.g., 12 hours). After achieving a uniform composition, the solution may be cooled down to room temperature before being poured onto ice (e.g., 200 mL) mixed with $H_2O_2$ (e.g., 3 mL). Subsequently, an HCl solution (e.g., a 100 mL 30% HCl solution) with a DI water bath may be used to wash away unwanted flakes. The resulting GO solution may have a concentration of 2.5 mg $mL^{-1}$ after diluting it in distilled water.

Next, the Al-GO solution is prepared (block 904). The Al powders ink may be prepared by adding micro Al powders (e.g., 30 mg of 99.5%, Sigma-Aldrich) into ethanol (e.g., 12 mL), followed by sonication (e.g., 1 minute). The concentration of the prepared Al powders solution may be 2.5 mg/mL. The Al-GO solution may be prepared by mixing the as-prepared GO solution and Al powders solution with a weight of, for example, 1:1, followed by shaking (e.g., 1 minute) on a tube vertex mixer and then sonication (e.g., 10 seconds). Thus, a high quality Al-GO solution with GO sheets and monodispersed Al powders can be obtained since the GO sheets serve as a surfactant to disperse Al micro powders to form a uniform Al-GO suspension.

Next, the Al-GO film is prepared (block 906), e.g., via vacuum filtration. A freestanding Al-GO film (e.g., 35 mm in diameter) may be obtained by filtering the Al-GO solution (e.g., 6 mL) through a membrane (e.g., 0.65 μm pore-sized membrane). The film on the membrane is then dried in the air. The Al-GO film may then be detached from the membrane naturally. Then, the Al-GO film is reduced (block 905). Thermal pre-reduction of the Al-GO film may be carried out in a furnace. For example, thermal pre-reduction of the Al-GO film may be carried out in a tube furnace under $H_2/Ar$ (5%/95%) atmosphere, held at 300° C. for 10 min with a ramping rate of 5° C./min.

An appropriate structure, such as glass slides, may be prepared to hold the Al-RGO film. Two copper ribbons may be attached at each side of the glass mount, functioning as the connections to an external circuit and heat sinks. Silver paste may be applied to both ends of the Al-RGO film as electrodes, forming an Ohmic contact to the later annealed film. Then, a rapid, high temperature thermal shock is applied (block 910) to the Al-RGO film by applying a voltage across the two copper ribbons to synthesize Al nanoparticles on the RGO film.

Figure 2A:
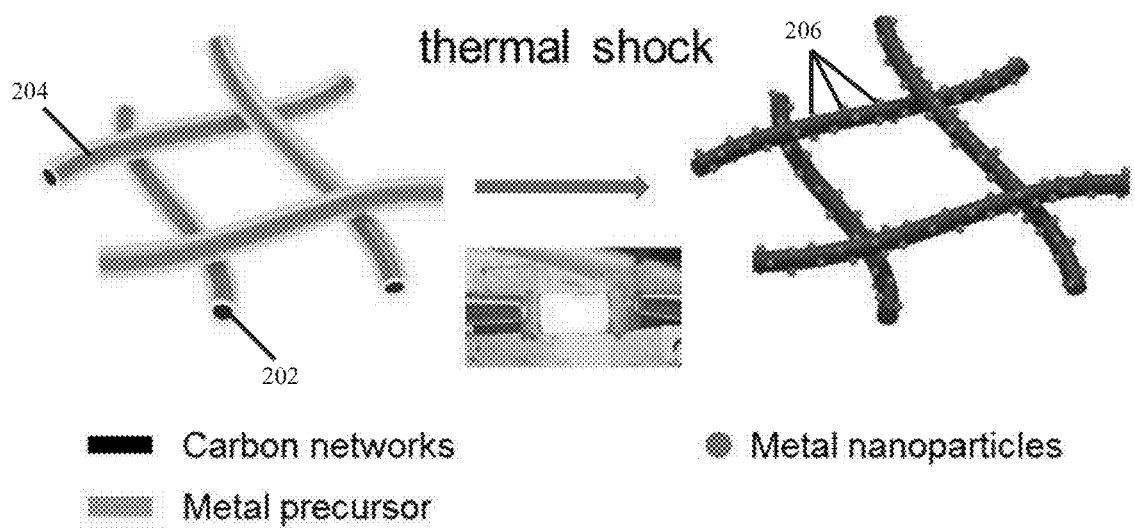
FIGS. 2A and 2B are schematic diagrams illustrating metallic nanoparticles, which are synthesized from salt precursors, uniformly deposited on carbon nanofibers in accordance with this disclosure.

In other embodiments, nanoparticles may be synthesized on substrates from salt precursors. The salt precursors may include or be made of metal chloride, metal nitrate, metal acetate, or any combination of these salt precursors. FIG. 2A is a schematic diagram illustrating a method of synthesizing metallic nanoparticles 206, e.g., Pd nanoparticles, on carbon networks 202 or carbon nanofibers (CNFs) from salt precursors 204, e.g., $PdCl_2$. The method involves uniformly depositing or forming salt precursors (e.g., $MCl_xH_y$ or $PdCl_2$) onto a conducting matrix (e.g., the carbon nanofibers 202). For example, the salt precursor $PdCl_2$ may be formed on a CNF surface by a dip-coating method. The precursor-loaded is then treated with a rapid thermal shock by Joule heating leading to decomposition of the precursors and nucleation of uniform nanoparticles 206, which are well-dispersed on the CNFs.

Figure 2B:
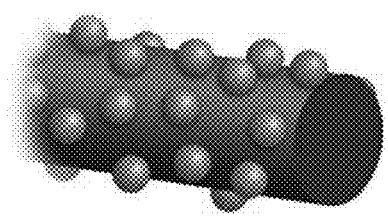
Figure 2B:
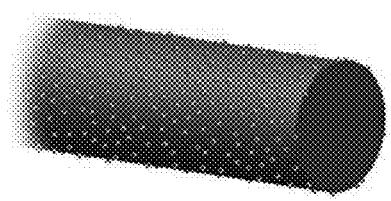

FIG. 2B illustrates a mechanism for controlling nanoparticle size by controlling the thermal shock durations. The longer high temperature thermal shock, e.g., 1 s, leads to particle agglomeration and coalescence at high temperature, thus increasing the particle sizes. A faster shock, e.g., 5 ms, creates smaller particle sizes. In other embodiments, the duration of the thermal shock may be greater than 1 s or less than 5 ms to control the nanoparticle size. For example, the duration of the thermal shock may be 5 s, 2 s, 100 ms, or 1 ms.

Figure 2C:
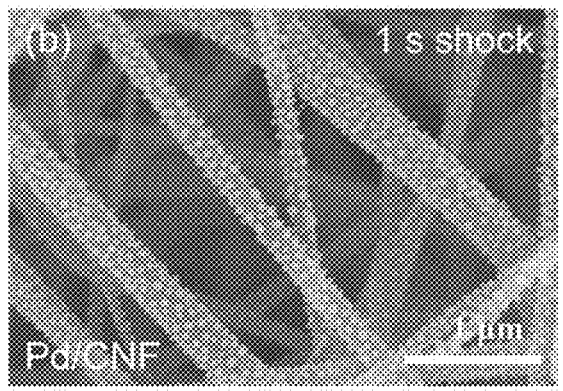
FIGS. 2C-2G are electron microscopy images illustrating different types of metallic nanoparticles uniformly synthesized on carbon nanofibers in accordance with this disclosure.
Figure 2D:
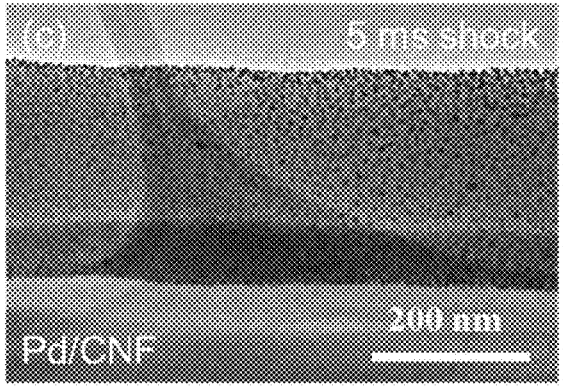
Figure 2E:
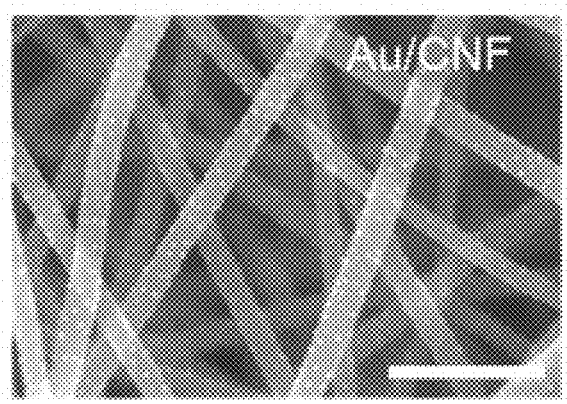
Figure 2F:
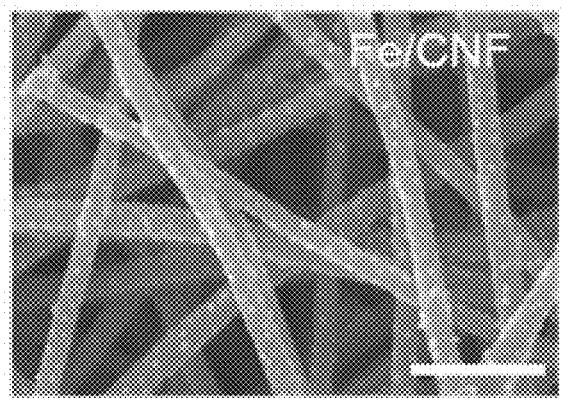
Figure 2G:
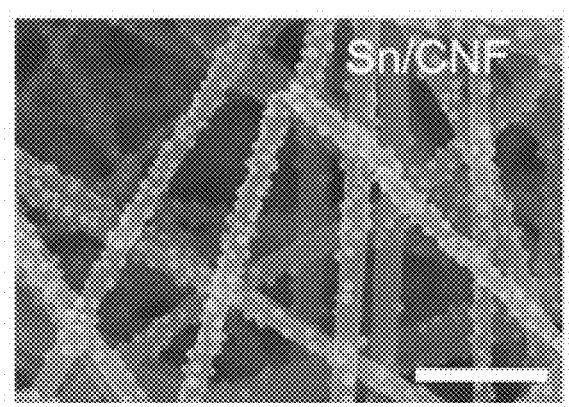

FIGS. 2C-2G are example electron microscopy images of metallic nanoparticles uniformly synthesized on CNFs by thermally shocking salt precursor-loaded CNFs. FIGS. 2C and 2D are scanning electron microscopy (SEM) and transmission electron microscopy (TEM) images, respectively, of Pd decorated CNFs after 1 s and 5 ms thermal shocks, respectively, at about 2000 K. A large number of Pd nanoparticles are formed and uniformly distributed along the CNFs. The average size of Pd nanoparticles formed by the 5 ms shock (e.g., about 4 nm) is much smaller compared to the 1 s shock (e.g., about 27 nm), demonstrating the effect of shock time on the synthesis of ultrafine nanoparticles. FIGS. 2E-2G are electron microscopy images of synthesized nanoparticles on CNFs for Au, Fe, and Sn, respectively, which demonstrates that the high temperature thermal shock method of this disclosure may be applied to a wide range of elements.

In embodiments, salt precursors may be deposited on or in a CNF film to form a precursor-loaded film to be heated according to any suitable heating method. For example, nanoparticles dispersed on a film may be formed by preparing a film, depositing a salt precursor on the film to obtain a salt precursor-loaded film, and then applying a thermal shock to the salt precursor-loaded film.

Figure 8:
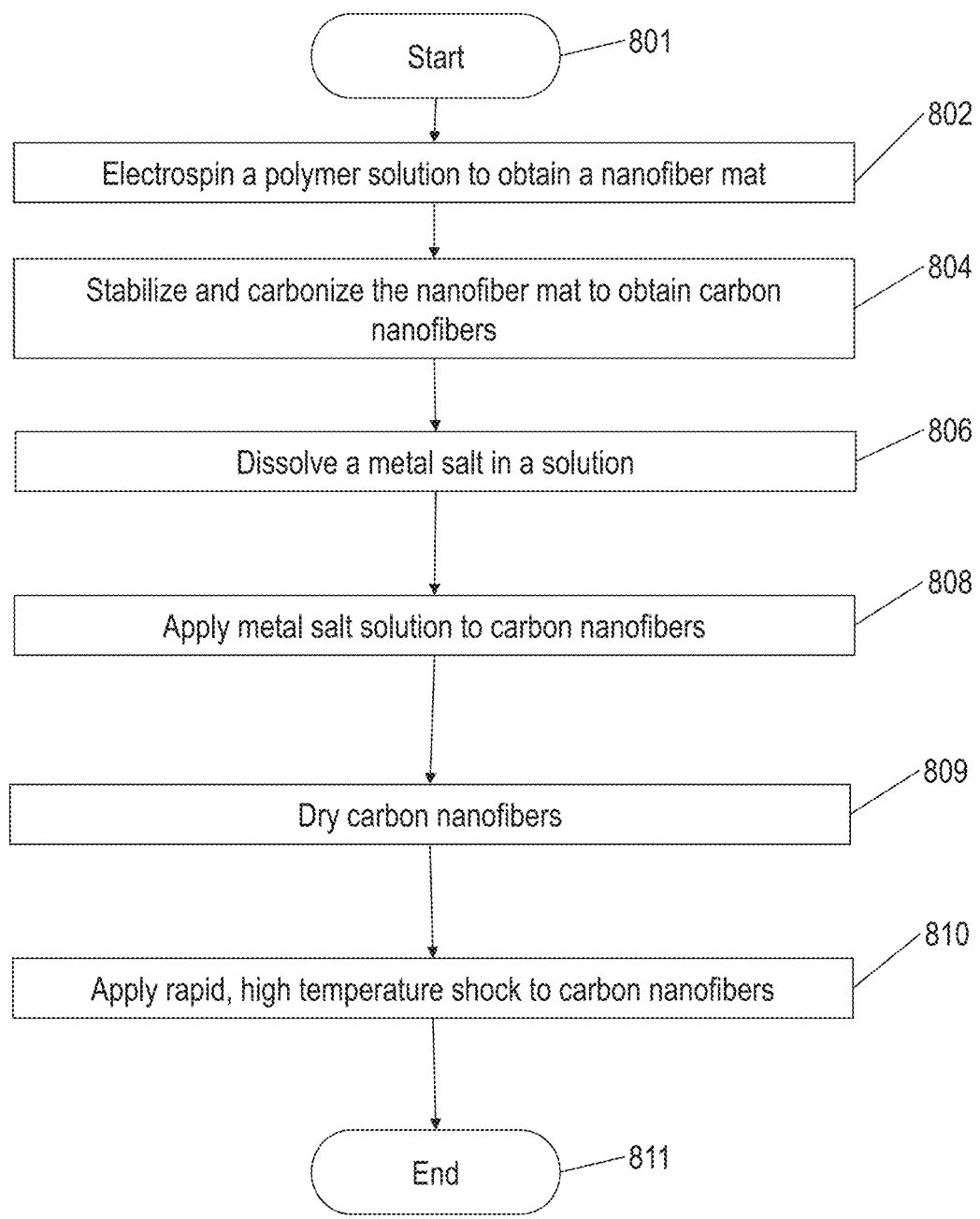
FIG. 8 is a flow diagram illustrating a method of synthesizing a metallic nanoparticle on carbon nanofibers from salt precursors in accordance with this disclosure.

In embodiments, a CNF film may be prepared according to the example method of FIG. 8. The nanofibers are prepared by electrospinning (block 802) a polymer solution (e.g., polyacrylonitrile (PAN) with a concentration of 8 wt % in dimethylformamide) at a designed spinning condition (e.g., a voltage of 10 kV, a spinning distance of 15 cm, and a rate of 1 mL/hour). The resulting nanofiber mat is then stabilized (e.g., by placing the nanofiber mat in air at, for example, 260° C. for 5 hours) and carbonized (e.g., by placing the stabilized nanofiber mat in an argon atmosphere at, for example, 600° C. for 2 hours) to obtain the CNFs (block 804).

Next, a salt (e.g., $PdCl_2$) is dissolved into a solution (e.g., water or ethanol) (block 806) and the resulting salt solution is deposited or applied into or onto the CNFs (e.g., by dipping, soaking, or vacuum filtration) (block 808) and dried (block 809). The resulting film (e.g., $PdCl_2$-CNF film) is then exposed to rapid, high temperature thermal shock to synthesize nanoparticles (e.g., Pd nanoparticles) on the CNFs.

Figure 3:
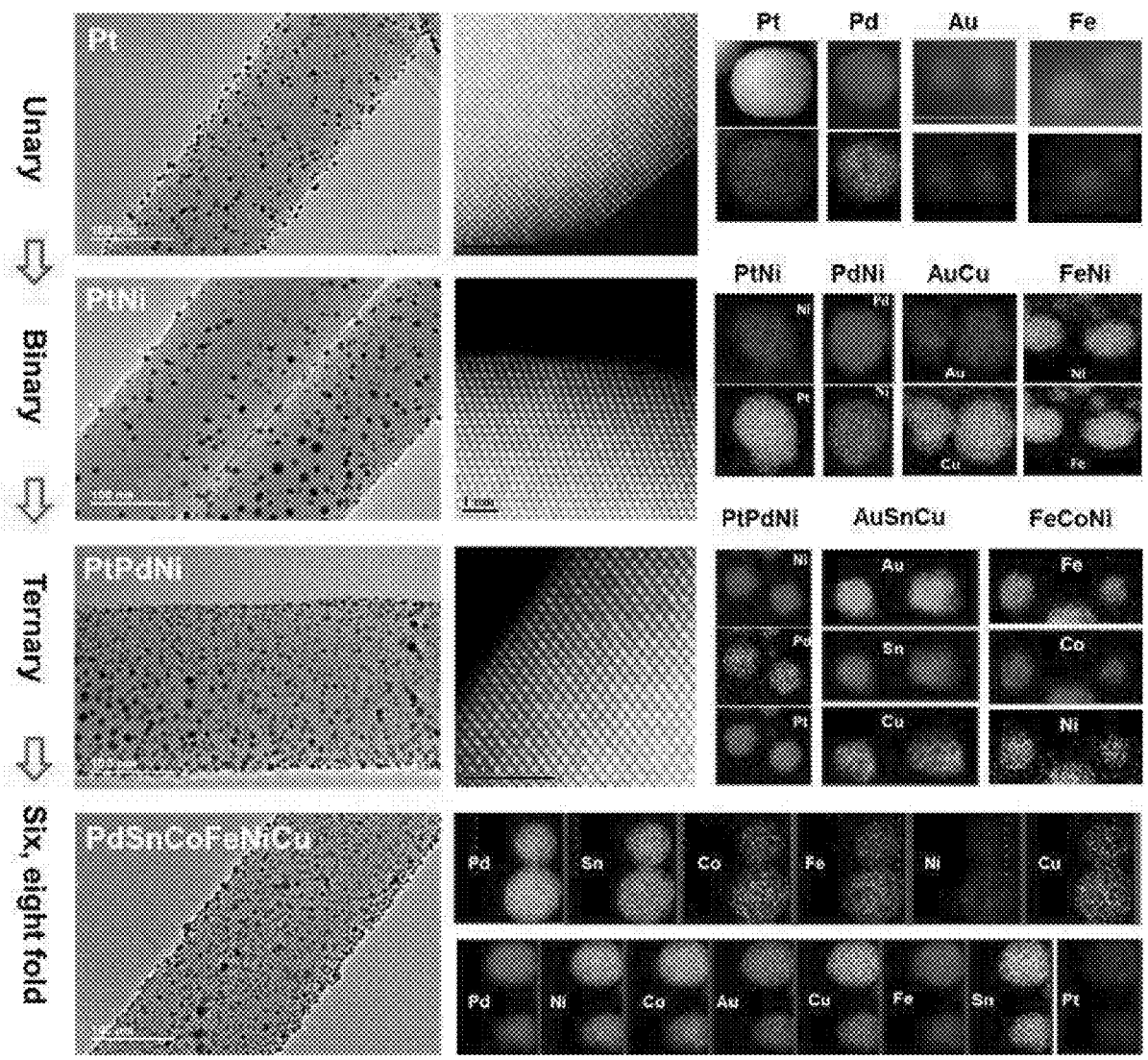
FIG. 3 shows SEM images and STEM elemental maps illustrating uniformly separated multi-metallic nanoparticles in accordance with this disclosure.

FIG. 3 shows TEM images and scanning transmission electron microscopy (STEM) elemental maps of unary (Pt, Pd, Au, and Fe), binary (PtNi, PdNi, AuCu, and FeNi), ternary (PtPdNi, AuCuSn, and FeCoNi), senary (PdSnCoFeNiCu), and octonary (PdNiCoAuCuFeSnPt) nanoalloys or nanoparticles, which may be synthesized by adding multiple salts to precursor solutions and performing the thermal shock process. As shown in FIG. 3, the nanoparticles are evenly dispersed across the carbon support. The nanoparticles may also possess size uniformity with diameters greater than 5 nm, regardless of the elemental compositions. Moreover, the nanoparticles are of nanoscale dimensions in fcc crystal structures. While FIG. 3 shows STEM elemental maps of specific uniformly separated multi-metallic nanoparticles (MMNPs) on carbon nanofiber substrates, other multi-metallic nanoparticles with different metal elements and combinations of metal elements may be synthesized.

Figure 4A:
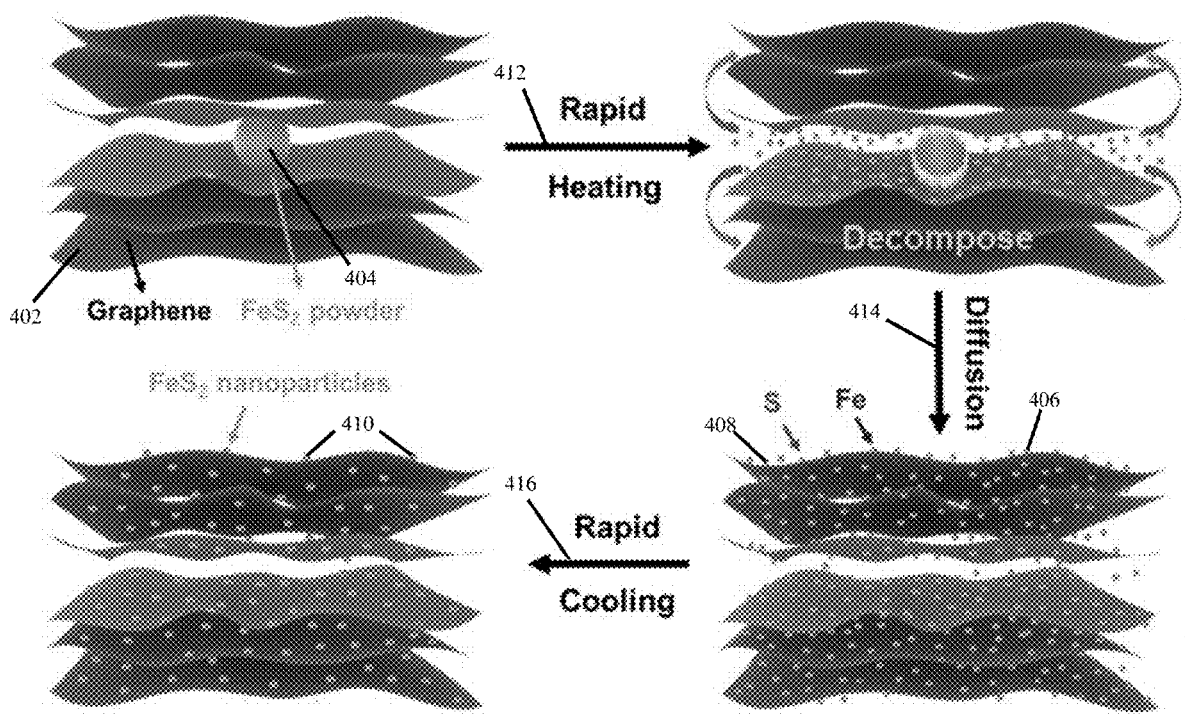
FIGS. 4A-4F show schematics and morphology of the synthesis for exemplary metal compound nanoparticles on RGO sheets in accordance with this disclosure.

FIG. 4A illustrates an example process of synthesizing inorganic compound nanoparticles on reduced grapheme oxide. In some embodiments, the inorganic compound nanoparticles may be CoB, CoS, or $FeS_2$. Synthesized $FeS_2$ nanoparticles derived from iron pyrite are highly efficient and stable electrocatalysts for water splitting. $FeS_2$ powders 404, which may be derived from iron pyrite, and graphene oxide flakes 402, which may be exfoliated from graphite through an improved Hummers' method, may be used as raw materials to fabricate a micro-$FeS_2$-RGO film. The nano-$FeS_2$-RGO film is in situ synthesized by directly joule heating 412 the as-prepared micro-$FeS_2$-RGO film to a high temperature (e.g., approximately 2470 K) in a short time (e.g., approximately 12 ms). After thermal shock treatment, $FeS_2$ nanoparticles 410 (e.g., having a size of 10-20 nm) are uniformly distributed on RGO nanosheets, as illustrated in FIG. 4A.

In the rapid heating process 412, in which the micro-$FeS_2$-RGO film may be heated up to 2470 K, $FeS_2$ powders decompose into Fe atoms 406 and S atoms 408. The Fe atoms 406 and S atoms 408 then diffuse 414 within the RGO matrix but remain in between the RGO layers under high temperature, thereby benefiting from the impermeability of RGO and the encapsulation effect of the RGO film. As rapid cooling 416 takes place, the Fe atoms 406 and S atoms 408 renucleate around the defects on the basal plane of the RGO nanosheets and crystallize into ultrafine $FeS_2$ nanoparticles 410. The $FeS_2$-RGO 3D nanostructure helps to maintain good mechanical integration and rapid electron transport of $FeS_2$ nanoparticles embedded in the RGO nanosheets.

The methods of this disclosure enable in situ synthesis of $FeS_2$ and other inorganic compound nanoparticles in an ultrafast, cost-effective, and scalable approach. $FeS_2$ nanoparticles transformed from iron pyrite through ultrafast thermal shock can be used as catalysts to split water. Benefiting from the ultrafine $FeS_2$ nanoparticles and the robust $FeS_2$-RGO 3D structure, the as-synthesized nano-$FeS_2$-RGO exhibits remarkable electrocatalytic performance for HER with, for example, only 139 mV overpotential to achieve 10 mA $cm^{-2}$ current in 0.5 m $H_2SO_4$ solution for long-term operation. This strategy may also be applicable to synthesize other transition metal dichalcogenides and may be extended to ternary or multicomponent compounds.

Figure 4B:
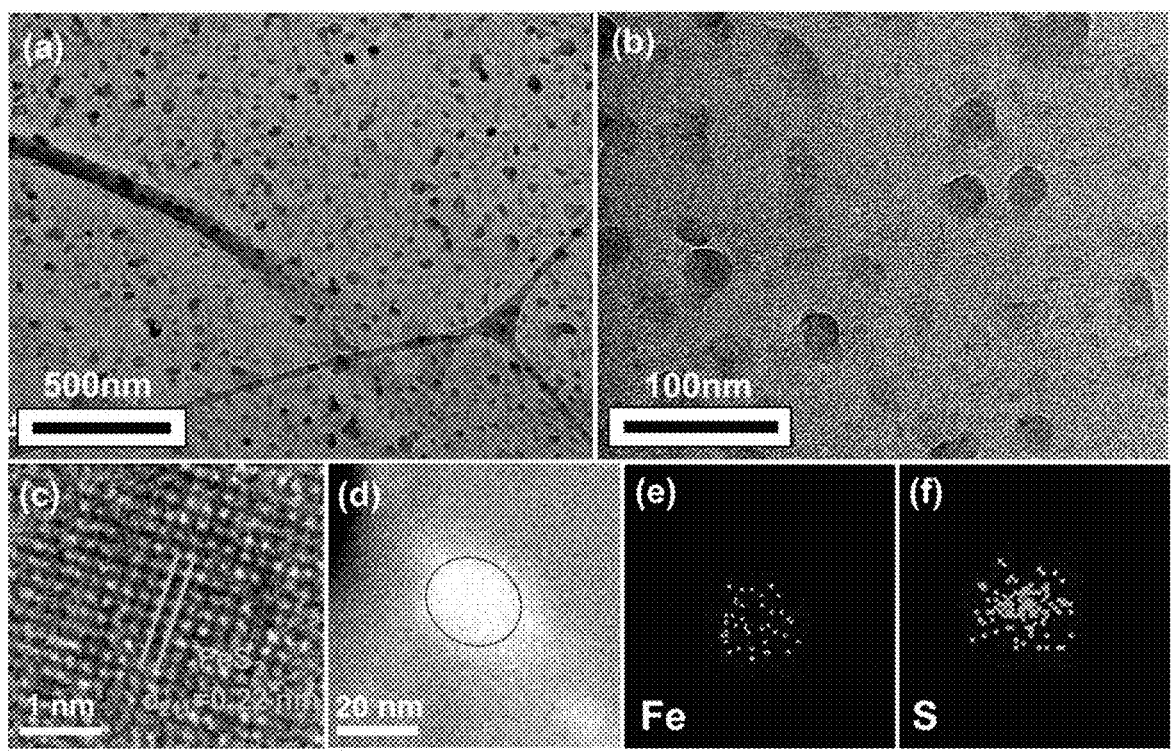

FIG. 4B show example transmission electron microscopy (TEM) images of the structure of the as-synthesized $FeS_2$ and RGO composite. TEM image (a) shows the typical spherical morphology of $FeS_2$ nanoparticles with an average size of 10-20 nm distributed on wrinkled 2D RGO nanosheets. Enlarged TEM image (b) illustrates that $FeS_2$ nanoparticles are uniformly embedded in the RGO nanosheets. High-resolution TEM image (c) shows lattice plane spacing of 0.22 nm, which corresponds to the crystal planes of the pyrite structure, indicating excellent crystallinity of the as-synthesized $FeS_2$ nanoparticles. The high-angle annular dark-field TEM image (d) of an $FeS_2$ nanoparticle and the corresponding EDX elemental mapping images (e) and (f) of as-synthesized $FeS_2$ nanoparticles show the distribution of Fe and S elements over the whole nanoparticle on the RGO nanosheet.

Figure 4C:
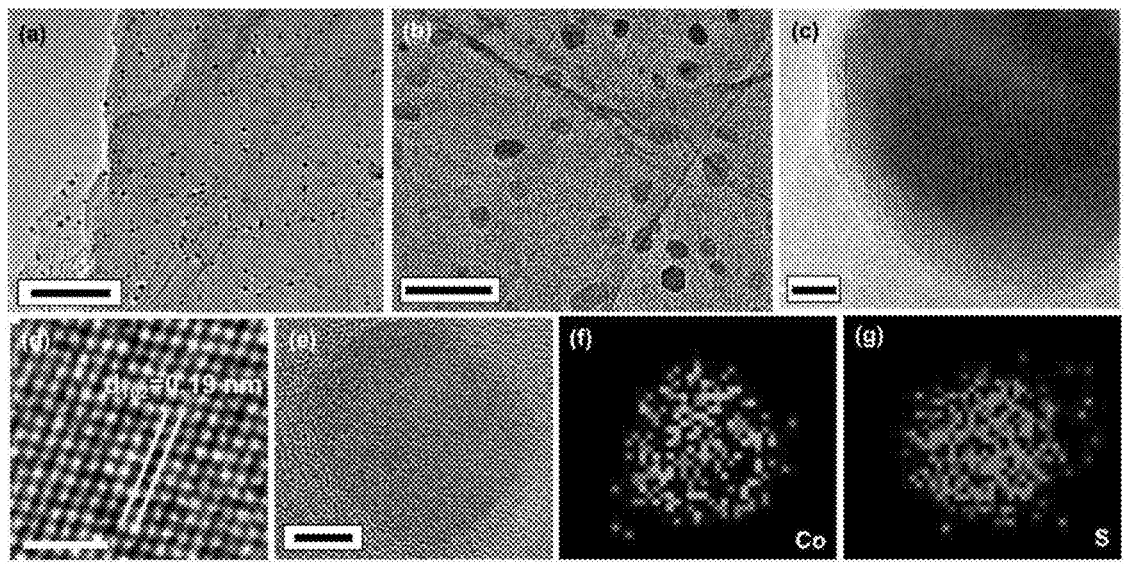

FIG. 4C show example transmission electron microscopy (TEM) images of synthesized CoS nanoparticles in accordance with this disclosure. TEM image (a) of FIG. 4C shows the uniform distribution of CoS nanoparticles on RGO nanosheets. Enlarged TEM image (b) shows CoS nanoparticles with an average size of 20 nm embedded in two-dimensional (2D) RGO nanosheets with strong adsorption. As shown in high resolution TEM image (c), the CoS nanoparticle may be coated with graphene layers, e.g., with a thickness of approximately 2 nm, corresponding to approximately six layers of graphene, which may be formed by the recrystallization of active carbon atoms on RGO nanosheets encapsulated in the whole RGO film during the ultrafast high temperature treatment. Carbon coatings on catalysts may play a role in the catalytic performance of catalysts in solution. A coated carbon shell on a catalyst with an appropriate thickness can prevent the catalyst from being directly exposed in solution and avoid corrosion during long term operation, while still ensuring efficient electron transport and maintenance of effective catalytic activity.

FIG. 4C shows an example atomic resolution TEM image (d) of a cobalt-sulfide nanoparticle, which shows crystalline planes with an interplanar distance of 0.19 nm. This can be ascribed to planes of CoS, confirming the excellent crystallinity of the synthesized CoS nanoparticles. The example high-angle annular dark-field TEM image (e) and the corresponding EDX elemental mappings (f) and (g) of CoS nanoparticles illustrate the homogeneous distribution of Co and S elements over the whole nanoparticle on the RGO nanosheet, demonstrating the uniform atomic mixture of Co and S atoms in as-synthesized particles.

Figures 4D, 4E, 4F:
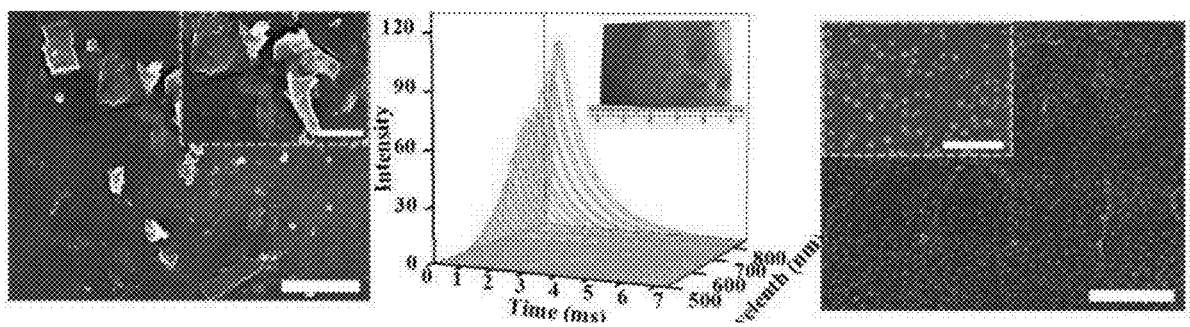

FIG. 4C shows example cobalt acetate and thiourea, forming approximately 1 µm clusters on graphene oxide film. The large-scale graphene oxide film containing cobalt acetate and thiourea mixture may be prepared by a simple casting method, as illustrated in the inset image of FIG. 4D. The morphology of as-prepared cobalt-sulfide nanoparticles is shown in FIG. 4E, which reveals that the cobalt-sulfide nanoparticles are approximately 20 nm in diameter and uniformly distributed on RGO nanosheets. A close view image in the inset of FIG. 4E shows that most of the nanoparticles are either spherical or ellipsoidal.

Figure 5A:
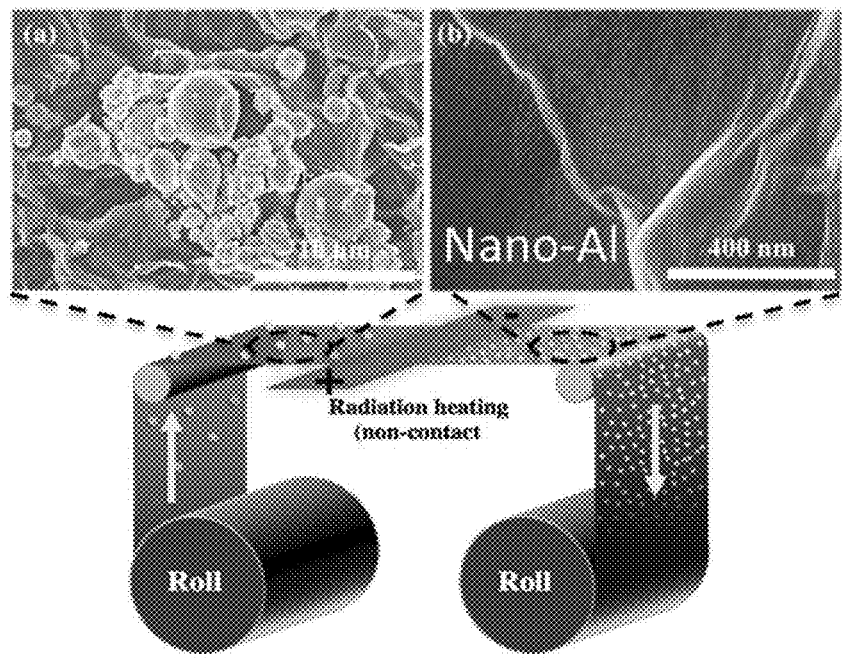
FIGS. 5A-5C are schematic diagrams illustrating systems for the scalable nanomanufacturing of nanoparticles through roll-to-roll manufacturing in accordance with this disclosure.

FIG. 5A is a schematic diagram illustrating a system for the scalable nanomanufacturing of nanoparticles through roll-to-roll manufacturing according to this disclosure. The roll-to-roll manufacturing system includes rollers and a heating zone. An RGO paper or graphite film embedded with micro-sized particles or carbon nanofibers coated with precursors may be fabricated. In the heating zone, a conductive RGO paper or graphite film is directly Joule heated or thermally radiative heated to a high temperature, e.g., 2000-3000 K. The film may experience fast heating and cool down after passing the heating zone. Different types of nanoparticle materials may be used including metal nanoparticles (e.g., Sn and Pd), inorganic nanoparticles (e.g., Si and Ge), and metal alloys. Other types of nanoparticle materials include Li, Ti, Ni, Pd, Cu, Al, Si, Sn, and other similar elements.

Figure 5B:
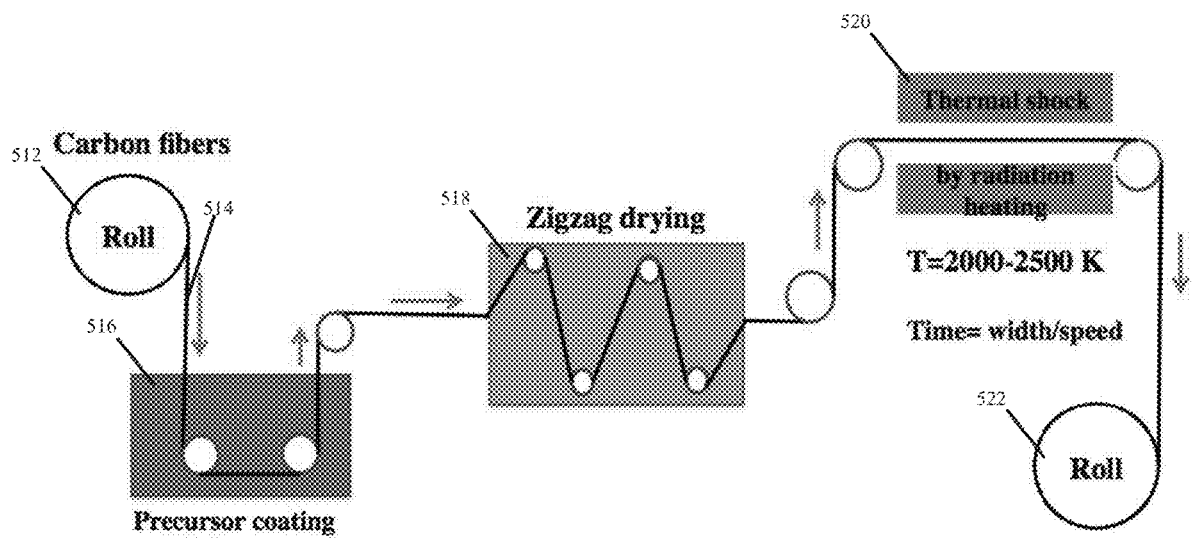

FIG. 5B is a schematic diagram illustrating for the scalable nanomanufacturing of nanoparticles through radiative heating and roll-to-roll manufacturing according to this disclosure. The system may include a rotatable member (not shown) or other structure for rotating a roll, on which a roll 512 of a carbon fiber sheet 514 is placed. The carbon fiber sheet 514 is passed through a precursor coating system or apparatus 516, which coats the carbon fiber sheet 514 with a salt precursor solution. The carbon fiber sheet 514 coated with the salt precursor solution is then passed through a zigzag drying machine 518 to dry the salt precursor onto the carbon fiber sheet 514. A rapid, high temperature thermal shock produced by radiation heating 520 is then applied to the carbon fiber sheet 514 having the salt precursor to synthesize a nanoparticle on the carbon fibers of the carbon fiber sheet 514. The carbon fiber sheet 514 with the nanoparticles is then rolled up into roll 522.

Figure 5C:
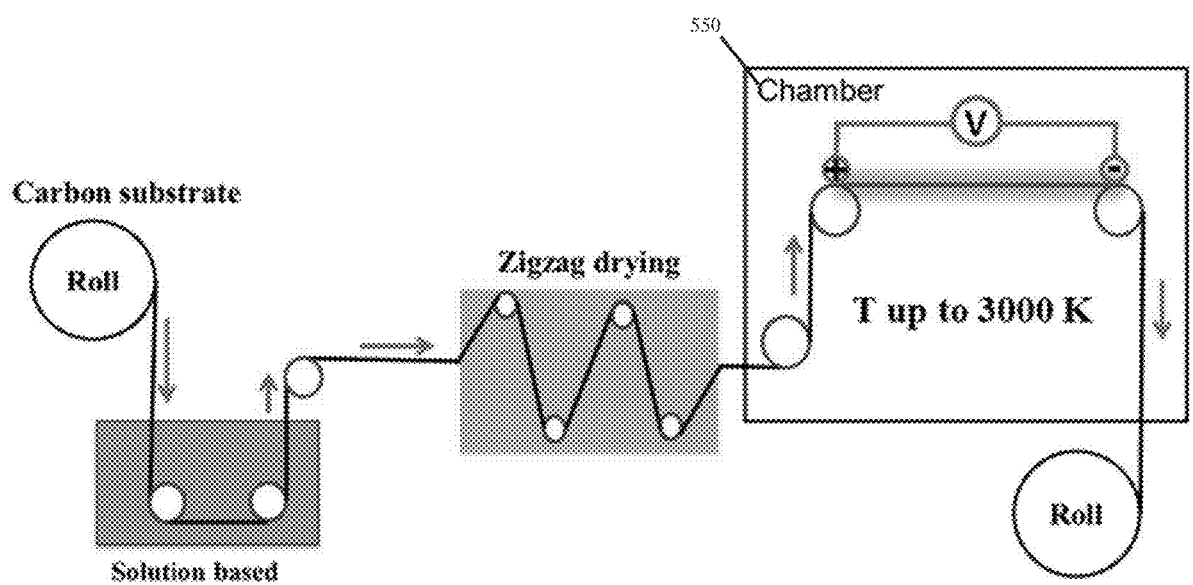

FIG. 5C is a schematic diagram illustrating another embodiment of the scalable nanomanufacturing of nanoparticles through direct Joule heating and roll-to-roll manufacturing according to this disclosure. The system is similar to the configuration and process of FIG. 5B but uses a direct Joule heating process in a chamber 550 for consecutive portions of the substrate sheet.

Figure 6A:
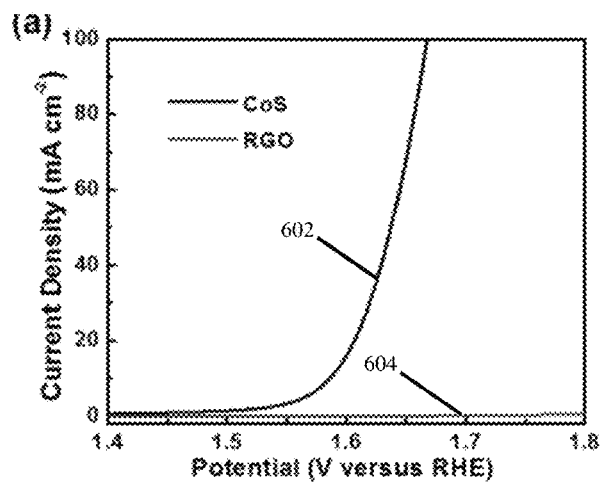
FIGS. 6A and 6B are graphs illustrating the properties of synthesized CoS nanoparticles.
Figure 6B:
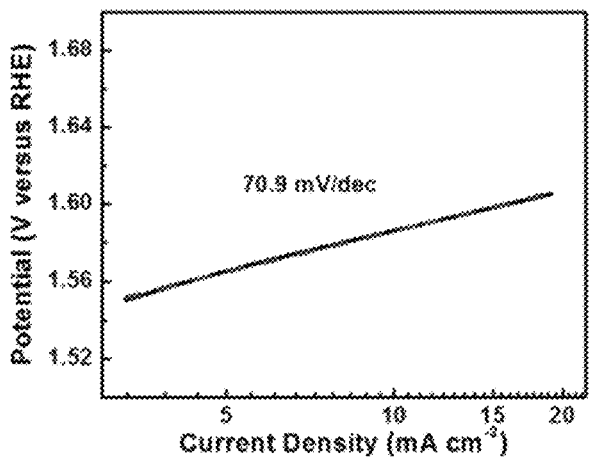

FIGS. 6A and 6B show exemplary oxygen evolution reaction (OER) activity of the CoS-RGO electrocatalyst in 1M KOH. As shown in FIG. 6A, the linear sweep of CoS 602 and RGO 604 shows that small potentials of, for example, approximately 1.58 V and 1.66 V versus reversible hydrogen electrode (RHE) are required to drive a 10 and 100 mA cm$^{-2}$ cathodic current, respectively, which is comparable to Ir—C (20 wt % Ir), indicating the superior electrocatalytic property for OER. In contrast, pure RGO exhibits negligible current in the measured potential range, suggesting the negligible contribution of pure RGO for OER. As shown in FIG. 6B, the small Tafel slope of approximately 71 mV dec$^{-1}$ confirms the excellent catalyst performance of CoS-RGO for OER.

Figure 6C:
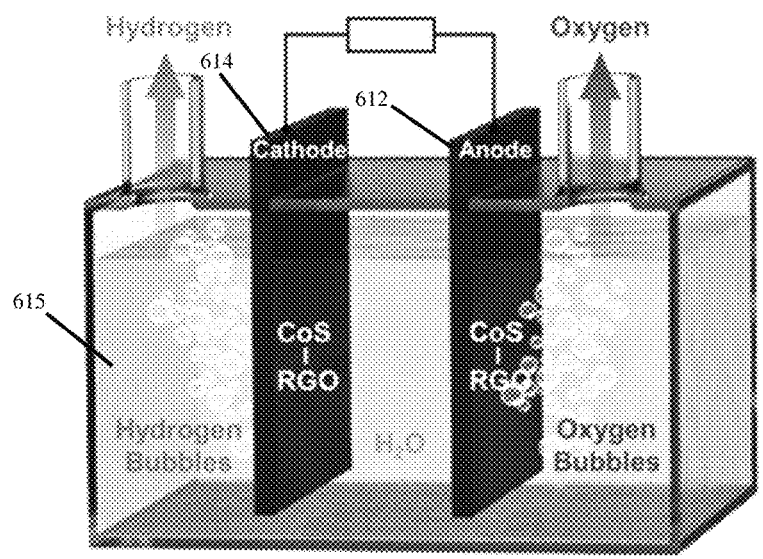
FIG. 6C is a schematic diagram illustrating water splitting apparatus having electrodes made of synthesized CoS nanoparticles.
Figure 6D:
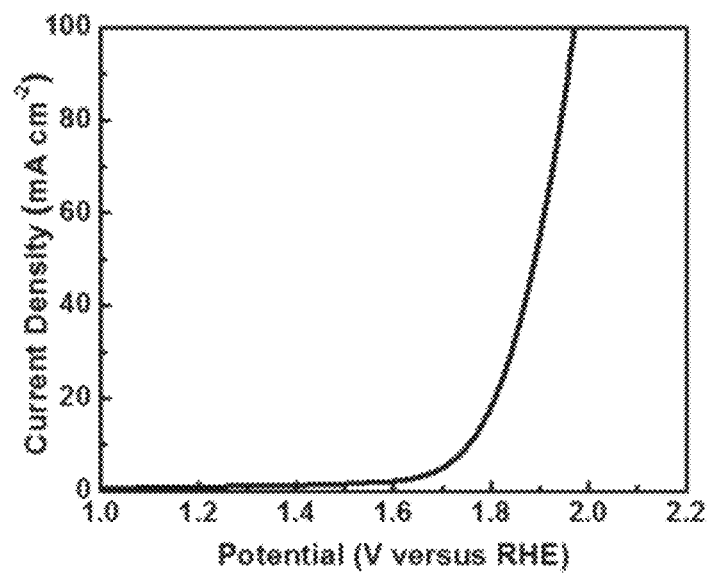
FIGS. 6D and 6E are graphs illustrating the water splitting performance of the synthesized CoS nanoparticles.

In embodiments, CoS-RGO may be employed as an efficient bifunctional catalyst for both OER and HER simultaneously. As shown in FIG. 6C, CoS-RGO may be fabricated as both an anode 612 and a cathode 614 in a two-electrode cell setup for water splitting in 1M KOH solution 615. The electrolysis using CoS-RGO as a bifunctional catalyst demonstrates impressive performance for overall water splitting. Small potentials of approximately 1.75 V and 1.97 V are required for CoS-RGO to reach 10 mA cm$^{-2}$ and 100 mA cm$^{-2}$ cathodic current, respectively.

Figure 6E:
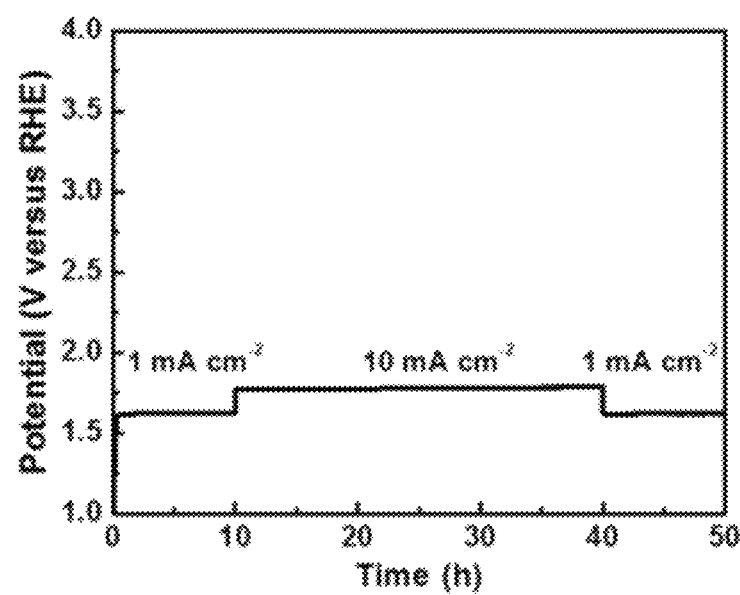

FIG. 6E shows an example of the long-term stability of electrolysis at a fixed current density of 1 mA cm$^{-2}$ and 10 mA cm$^{-2}$ for 50 h. The voltage stabilizes at, for example, approximately 1.62 V to achieve 1 mA cm$^{-2}$ current for 10 h continuous operation, then stabilizes at approximately 1.77 V to achieve 10 mA cm$^{-2}$ current for 30 h continuous operation. After switching the current density back to 1 mA cm$^{-2}$, the voltages again stabilize at approximately 1.62 V, indicating no structural change of the active catalysts even after 30 h of operation under high current density. This stability at different current densities without any decay illustrates the advantage of carbon-coated CoS nanoparticles on RGO for overall water splitting.

The electrocatalytic performance of CoS-RGO is attributed to the chemical composition and electronic structure of the synthesized CoS nanoparticles grown on N and S doped RGO nanosheets. Additionally, the N and S doping introduces defects on RGO nanosheets to form additional catalytic sites, and simultaneously induces the electronic interactions with nearby CoS nanoparticles, which are beneficial to enhance the catalytic performance for water splitting. The thin carbon coating on CoS active surface plays an important role in the corrosion resistance, resulting in impressive electrocatalytic stability.

Figure 7A:
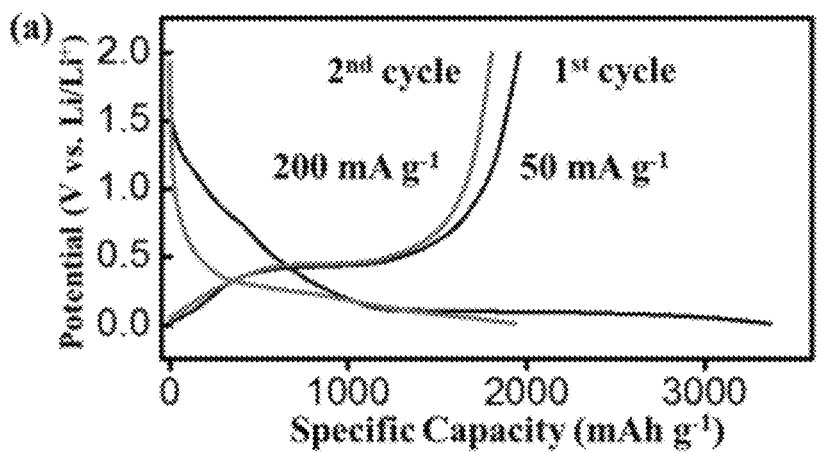
FIGS. 7A and 7B are graphs illustrating the electrochemical performance of the synthesized Si nanoparticles as the anode of Li-ion battery in accordance with this disclosure.
Figure 7B:
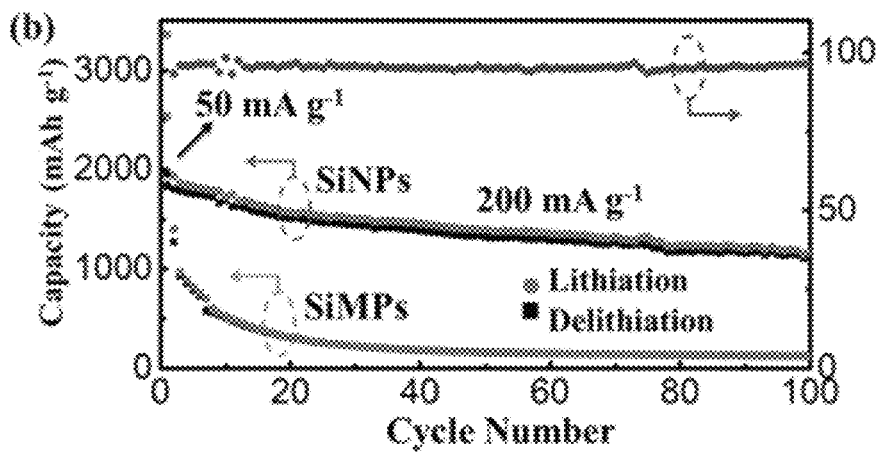

In embodiments, the nanoparticles synthesized according to methods of this disclosure may be used in energy storage devices. FIGS. 7A and 7B are graphs illustrating the electrochemical performance of a thermally-shocked, synthesized RGO-Si nanoparticle (NP) composite film as a high-capacity anode of a Li-ion battery. The RGO-Si nanoparticle composite films were placed in coin cells and acted as a freestanding carbon/binder-free electrode. The electrochemical performance of the RGO-Si nanoparticle composite film was elucidated by galvanostatic discharge—charge measurements.

FIG. 7A shows example discharge—charge curves of the RGO-Si nanoparticle anode for the first two cycles. The cell was cycled with a potential window of 0.01 to 2.0 V (vs Li/Li+) at a current density of 50 mA $g^{-1}$. In the initial discharge cycle, the potential maintains a long flat plateau at around 0.1 V and then gradually decreases to 0.01 V. This corresponds to Li insertion into crystalline Si, causing the formation of an amorphous $Li_xSi$ phase. The first charge curve displays a plateau at 0.42 V, which corresponds to the delithiation process. Subsequent discharge and charge curves show characteristic voltage profiles of Si. The overall discharge and charge capacities for the first cycle are 3367 mA h $g^{-1}$ and 1957 mA h $g^{-1}$, respectively, corresponding to an initial Coulombic efficiency of 58%. The initial Coulombic efficiency can be improved by compositing controlled amount of molten Li into the RGO/nanoparticles composites to compensate for the Li loss in the first cycle. The RGO-Si nanoparticles can deliver a volumetric capacity of 3543 mA h $cm^{-3}$ with an areal capacity of 2.48 mA h $cm^{-2}$ at 0.13 mA $cm^{-2}$.

An example of the capacity retention of the RGO-Si nanoparticle electrode at 200 mA $g^{-1}$ between 0.01 and 2.0 V is shown in FIG. 7B. The capacity decreased to 1165 mA h $g^{-1}$ over 100 cycles, which is ascribed to a small capacity decay of 0.40% per cycle. Conversely, the RGO-Si nanoparticle film delivered a small charge capacity of 126 mA h $g^{-1}$ over 100 cycles with a severe capacity loss of 0.95% per cycle. The excellent cycling performance of the RGO-Si nanoparticle film is due to the ultrafine Si nanoparticles and the RGO matrix reducing the strain and accommodating the Si volume changes associated with the lithiation/delithiation electrochemical process.

The performance of nanoparticles in the RGO matrix can be optimized by varying the process conditions. For example, the RGO functional groups can be altered, and the specific hold time and synthesis temperature can control the NP size.

Figure 7C:
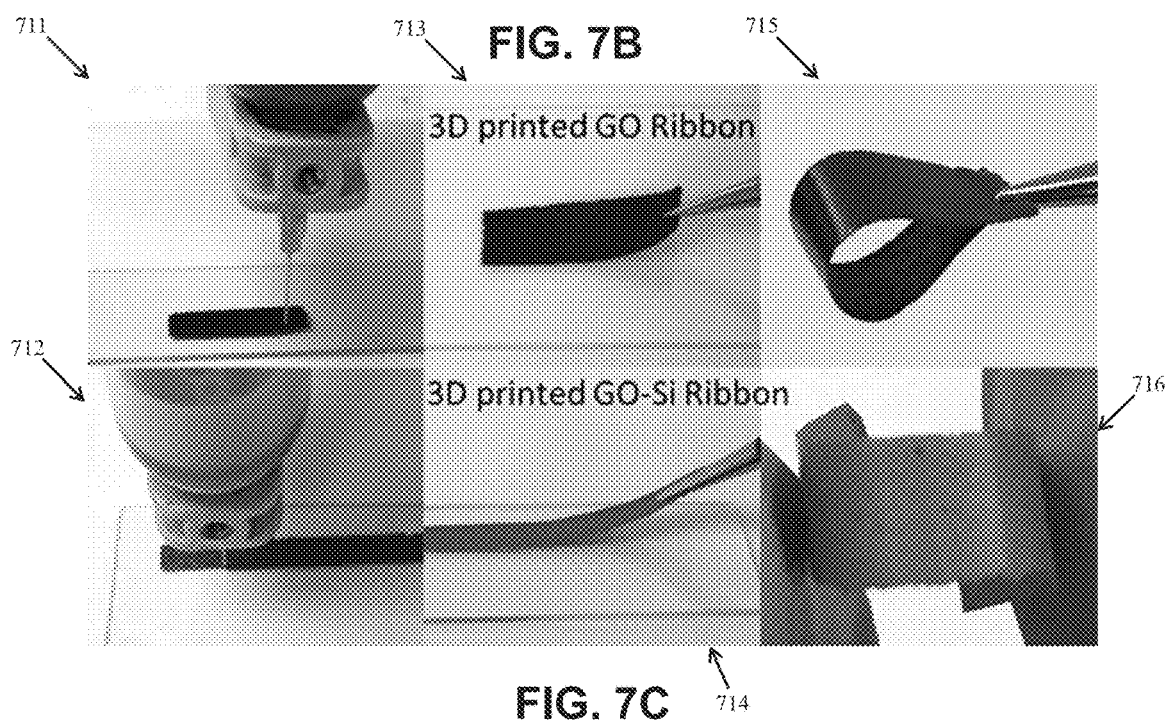
FIG. 7C is a series of images illustrating 3D printing of GO and GO-Si ribbons and the various manipulations of those ribbons in accordance with this disclosure.

The rapid, in situ synthesis of nanoparticles via high-temperature radiative heating can be scaled up by three-dimensional (3D) printing, e.g., by 3D printing RGO ribbons, as shown in the example image 711 of FIG. 7C, and RGO-SiMPs ribbons, as shown in the example image 712 of FIG. 7C. The 3D printed ribbons may be peeled off from a substrate, such as a glass substrate, to form freestanding and highly flexible electrodes as shown in images 713 and 714 of FIG. 7C. The 3D printed GO ribbon is flexible as it can be bent approximately 180° as shown in the example image 715 of FIG. 7C and the GO-Si ribbon can be wound into a spiral shape as shown in image 716 of FIG. 7C. To achieve scalable manufacturing of high-capacity nanoparticle anodes, a potential roll-to-roll setup can be used where freestanding RGO-nanoparticle composites with sufficient mechanical strength enter into the high-temperature thermal-shock zone for in situ synthesis of RGO-nanoparticles. The thermal shock time (t=L/V) is determined by the length of the high temperature zone (L) and the roll-to-roll speed (V). In embodiments, 5-15 nm Sn nanoparticles may be synthesized in a short time (e.g., ~1 s), which demonstrates the potential of this method for commercial production.

Figure 10:
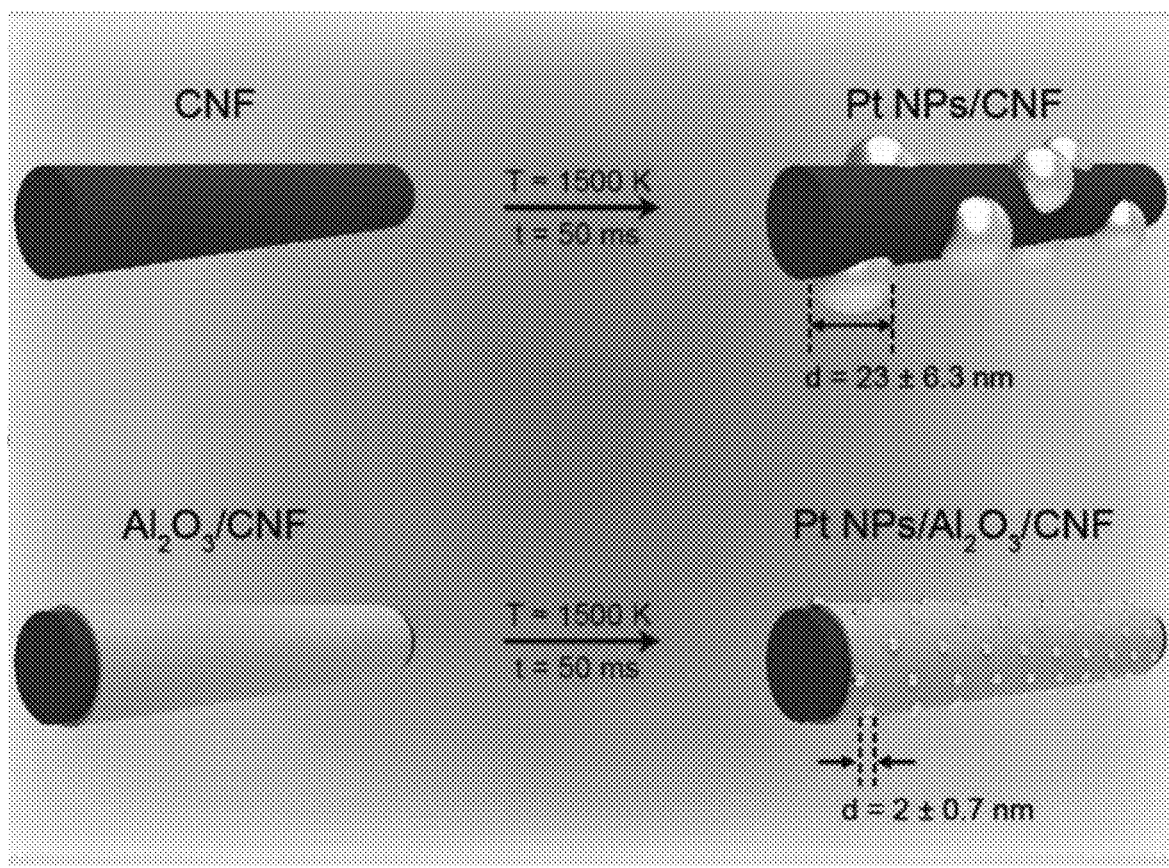
FIG. 10 is a schematic diagram illustrating particle size-control by modifying the surface of the substrate to tune the wetting behavior of the substrate with the nanoparticles in accordance with this disclosure.

FIG. 10 is a schematic diagram illustrating particle size control by modifying a surface of the substrates to tune the wetting behavior between the substrates and the nanoparticles. For example, coating a layer of oxide on carbon substrates can make the metallic nanoparticles smaller as compared with bare carbon substrates. In an example process, a $CNF-H_2PtCl_6$ or $CNF—Al_2O_3—H_2PtCl_6$ (CNF coated with $Al_2O_3$) system is Joule heated to about 1500 K for about 50 ms in an argon environment and cooled down immediately or quickly thereafter. The resulting high-density Pt nanoparticles dispersed uniformly on the surface of the bare CNFs were 23 nm±6.3 nm in average diameter. Employing the same $H_2PtCl_6$ precursor and rapid thermal pulse parameters, the average nanoparticle size and distribution changes with the $Al_2O_3$ coating (e.g., a 10 nm $Al_2O_3$ coating), leading to one order of magnitude smaller nanoparticle sizes and narrower size distributions (e.g., 2 nm±0.7 nm). Further details regarding particle size control are found in the appendix to the specification.

The interaction between the nanoparticles and the substrates plays a role in determining the particle morphology, distribution, and properties. By tuning the wetting or interaction between the substrates and the nanoparticles, the design of nanoparticles with enhanced dispersion and controlled particle size may be achieved.

In embodiments, the surface modification can be achieved by coating of an additional layer on the substrates by gas phase, solution phase or solid phase reactions and processes. For example, atomic layer deposition (ALD) may be used to deposit oxide layers on the substrates. The surface modifications may also be achieved by surface treatment using gas phase, solution phase, or solid phase reactions or processes. For example, thermal annealing in a $CO_2$ atmosphere may be performed to create surface defects.

Nanoparticles, and systems and methods for synthesizing nanoparticles from micro-sized particles or salt precursors on substrates in accordance with this disclosure are detailed above, as is the verification of these materials and methods through experimentation. Persons skilled in the art will understand that the features specifically described hereinabove and shown in the accompanying figures are non-limiting exemplary embodiments, and that the description, disclosure, and figures should be construed merely as exemplary of particular embodiments. It is to be understood, therefore, that the present disclosure is not limited to the precise embodiments described, and that various other changes and modifications may be effected by one skilled in the art without departing from the scope or spirit of the disclosure.

The invention claimed is:

1. A method of forming nanoparticles on a substrate, the method comprising:
   depositing salt precursors on a substrate; and
   applying a rapid, high temperature thermal shock to the substrate and the salt precursors to cause the salt precursors to become nanoparticles on the substrate,
   wherein the high temperature thermal shock is between about 500 K and about 3000 K, and
   a duration of the high temperature thermal shock is between about 1 ms and about 5 s.

2. The method of claim 1, wherein the nanoparticles are metallic, ceramic, inorganic, semiconductor, compounds, or any combination thereof.

3. The method of claim 1, wherein the salt precursors comprise metal chloride, metal nitrate, metal acetate, or any combination thereof.

4. The method of claim 1, wherein the nanoparticles have an average diameter of between about 1.0 nm and about 20 nm.

5. The method of claim 1, wherein the substrate is a carbon-based substrate, a conducting substrate, or a non-conducting substrate.

6. The method of claim 5, wherein the carbon-based substrate is a reduced graphene oxide substrate or a carbon nanofiber substrate.

7. The method of claim 6, further comprising:
electrospinning a polymer solution to obtain a nanofiber mat; and
stabilizing and carbonizing the nanofiber mat to obtain the carbon nanofiber substrate.

8. The method of claim 6, wherein depositing salt precursors on a substrate includes:
dissolving a salt precursor in a solution;
applying the salt precursor solution to carbon nanofibers; and
drying the carbon nanofibers to obtain a precursor-loaded carbon nanofiber substrate.

9. The method of claim 6, further comprising:
synthesizing graphene oxide;
forming a graphene oxide assembly; and
reducing the graphene oxide assembly to obtain the reduced graphene oxide substrate.

10. The method of claim 5, wherein the conducting substrate is a metal-based substrate or includes conductive oxides.

11. The method of claim 5, wherein the non-conducting substrate is a textile or wood.

12. The method of claim 1, wherein the high temperature thermal shock is provided by direct Joule heating, high temperature radiation heating, microwave heating, plasma heating, or laser heating.

13. The method of claim 1, further comprising modifying the substrate to change the wetting or interaction between the substrate and the nanoparticles so as to control a size or dispersion of the nanoparticles on the substrate.

14. The method of claim 13, wherein modifying the substrate includes coating a layer on a surface of the substrate by gas phase, solution phase, or solid phase reactions or processes.

15. The method of claim 13, wherein modifying the substrate includes treating a surface of the substrate using gas phase, solution phase, or solid phase reactions or processes.

16. A method of forming nanoparticles on a substrate, the method comprising:
depositing salt precursors on a substrate; and
applying a rapid, high temperature thermal shock to the substrate and the salt precursors to cause the salt precursors to become nanoparticles on the substrate,
wherein the high temperature thermal shock is between about 500 K and about 3000 K, and,
a duration of the high temperature thermal shock is based on a desired size of the nanoparticle.

* * * * *